United States Patent [19]

Harrington et al.

[11] 4,328,611
[45] May 11, 1982

[54] METHOD FOR MANUFACTURE OF AN INTERDIGITATED COLLECTOR STRUCTURE UTILIZING ETCH AND REFILL TECHNIQUES

[75] Inventors: Alan L. Harrington, Glendale; Richard Allison, Los Angeles, both of Calif.

[73] Assignee: TRW Inc., Los Angeles, Calif.

[21] Appl. No.: 144,672

[22] Filed: Apr. 28, 1980

[51] Int. Cl.³ ............... H01L 21/20; H01L 21/74
[52] U.S. Cl. .................................. 29/580; 29/578; 148/175; 156/643; 156/647; 156/662; 357/20; 357/34; 357/36; 357/89
[58] Field of Search .............. 29/580, 578; 148/175; 156/643, 647, 662; 357/20, 34, 36, 89

[56] References Cited

U.S. PATENT DOCUMENTS

| | | | |
|---|---|---|---|
| 3,220,896 | 11/1965 | Miller | 148/175 X |
| 3,244,950 | 4/1966 | Ferguson | 357/20 |
| 3,312,881 | 4/1967 | Yu | 357/20 X |
| 3,312,882 | 4/1967 | Pollock | 357/36 X |
| 3,832,225 | 8/1974 | Matsui et al. | 156/647 X |

*Primary Examiner*—L. Dewayne Rutledge
*Assistant Examiner*—W. G. Saba
*Attorney, Agent, or Firm*—Martin R. Horn

[57] ABSTRACT

A bipolar semiconductor is manufactured by forming a plurality of grooves along the vertical (111) planes in a high resistivity epitaxial silicon layer which is disposed on an N+ (110) oriented substrate. Low resistivity epitaxial silicon of the same conductivity type is then used to fill in the grooves, thus forming alternate vertical regions of high and low resistivity. A base region is then diffused into said epitaxial layer and a plurality of emitters regions are diffused into said base region at locations directly above the low resistivity epitaxial regions.

13 Claims, 5 Drawing Figures

METHOD FOR MANUFACTURE OF AN INTERDIGITATED COLLECTOR STRUCTURE UTILIZING ETCH AND REFILL TECHNIQUES

BACKGROUND OF THE INVENTION

1. Field of the Invention

This invention relates to bipolar transistors, and more particularly, to a method for manufacture of an interdigitated collector structure for such transistors.

2. Prior Art

In the design of bipolar power transistors, three goals must be taken into consideration. It is desirable to have as high a breakdown voltage as possible while attaining minimum collector series resistance as well as minimum base-collector capacitance.

These three goals are difficult to attain in one transistor. For example, when the resistivity of the material between the base and the collector is low, the capacitance between the base and the collector is high. This requires a compromise to be struck between low resistivity and low capacitance. Also, providing for a low collector series resistance tends to result in a lower junction breakdown voltage.

One prior art method for raising the junction breakdown voltage while retaining a low collector series resistance is to implant guard rings in the substrate surrounding the base. These guard rings have the function of raising the breakdown voltage around the edges of the base, the location where breakdown is most likely. However, the use of guard rings requires extra processing as well as using up extra valuable space.

Another prior art method to achieve all three goals without the use of guard rings is to form low resistance pedestals up from the collector into a high resistivity epitaxial layer between the collector and the base and directly beneath each emitter. This has been accomplished by heavily doping discrete regions in the collector prior to the formation of the epitaxial layer. After the deposition of the epitaxial layer, the device is heated causing the dopant therein to out-diffuse from the collector into the epitaxial layer, thus doping the upwardly adjacent regions in the epitaxial layer to form pedestals on top of the collector. The emitters were then aligned to be located directly above each of these pedestals.

This prior art method has a number of drawbacks. First, the double diffusion, first into the collector and then the out-diffusion into the epitaxial layer, results in imprecisions in the formation in the pedestals. One such imprecision is in the level of doping of the pedestals. It has been found that the method described results in a high gradient of doping from the bottom of the pedestal adjacent to the collector to the top of the pedestal. This results in a difficulty in accurately manufacturing a device with known base-collector resistance. It is also difficult to precisely predetermine the shapes of the pedestals. Irregularities such as rounding occur. The result of these problems is that the design of the transistor is limited to these designs which can tolerate such irregularities. In addition, the operations required to form the pedestals using this method are cumbersome and costly.

BRIEF SUMMARY OF THE INVENTION

It is an object of this invention to provide a method for manufacturing an interdigitated pedestal collector structure for bipolar transistors, and particularly for UHF power transistors.

It is a further object of this invention to provide a method for manufacturing a bipolar transistor wherein the junction breakdown voltage is maximized and the collector series resistance and the base-collector capacitance are minimized.

It is yet another object of this invention to provide a method of the type described which is simple to use and can be used with high precision and flexibility of design.

A high resistivity epitaxial N layer which is disposed on an N+(110) oriented substrate is masked such that the edges of the holes in the masking are parallel to the (111) planes that intersect the (110) surface perpendicularly. Grooves in the high resistivity epitaxial layer are then etched beneath the openings in the masking down to the N+ substrate. The grooves can then be back filled with epitaxial silicon of a much lower resistivity than that of the surrounding regions. Once the groove pattern is set and refilled, the pattern structure can be used as an interdigitated collector structure.

The low resistivity silicon which was deposited in the grooves serves the same function as the pedestal of the prior art. However, the exact dimensions of these regions can be controlled much more precisely due to the masking and the etching properties along the (111) planes. In addition, the concentration of dopant in these regions can be made uniform since they are not the result of diffusion. Grooving first, then back filling allows much greater physical design dimensions than the prior art method for making buried layer collector pedestal regions.

After the interdigitated pedestal collector structure is made, the dopant for the base region can be diffused into the epitaxial layer using methods well known in the art. Similarly, the emitter regions can be diffused into the base at points directly above the low resistivity pedestals.

Since the region directly beneath each emitter has low resistivity, the collector series resistance also is low. However, since the surrounding regions in the epitaxial layer are of high resistivity, the open base-collector capacitance remains high. Also, using the present method, the regions adjacent the edges of the base can have high resistance, thus resulting in a high junction breakdown voltage, while still allowing a low resistance between the base and the collector in the areas directly beneath the emitters.

The novel features which are believed to be characteristic of the invention, both as to its organization and method of operation, together with further objectives and advantages thereof, will be better understood from the following description considered in conjunction with the accompanying drawings in which a presently preferred embodiment of the invention is illustrated by way of example. It is to be expressly understood, however, that the drawings are for the purpose of illustration and description only, and are not intended as a definition of the limits of the invention.

DETAILED DESCRIPTION OF THE PREFERRED EMBODIMENT

Figure 1:
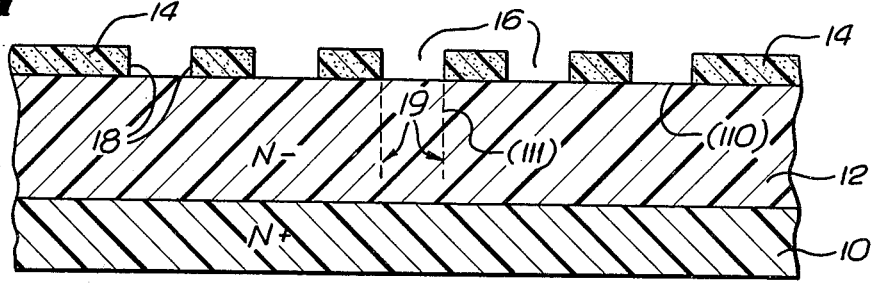
FIG. 1 is a cross-sectional view of a semiconductive device wherein an epitaxial layer deposited on top of a silicon substrate has been masked with openings parallel to the vertical (111) planes.

FIGS. 1 through 5 show the steps which comprise the method of the present invention. Referring first to FIG. 1, there is shown a silicon substrate 10 which is of N+ type conductivity and acts as the collector for the completed transistor. Disposed on top of said substrate 10 is an epitaxial layer 12 also of N-type conductivity, but doped at a much lower concentration level. The conductivity of said epitaxial layer 12 is approximately 100 ohms/cm. The epitaxial layer 12 is disposed such that the top surface thereof lies in the (110) plane.

On top of the epitaxial layer 12 is disposed a masking layer 14 of $SiO_2$ such that there are alternating regions of masking 14 and openings 16 in said masking layer 14. The edges 18 of the holes 16 in the masking layer 14 define parallel rectangles when viewed in top plan in the surface of the epitaxial layer 12. Also, the edges 18 of the masking layer 14 are parallel to the (111) planes 19 that perpendicularly intersect the (110) surface of the epitaxial layer 12.

Figure 2:
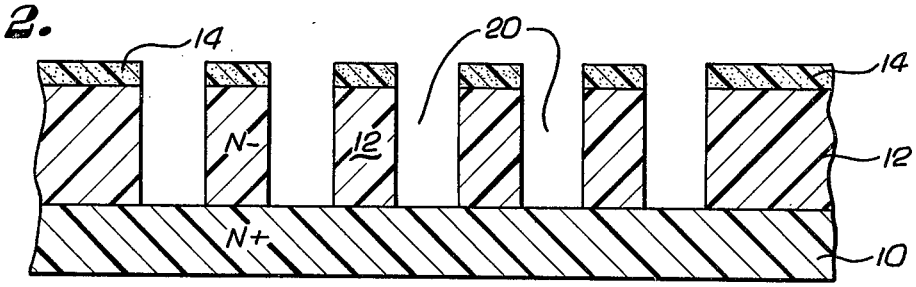
FIG. 2 is a cross-sectional view of a semiconductive device wherein the regions below the openings in the mask have been selectively etched.

Referring next the FIG. 2, an etchant is applied which etches the regions beneath the openings 16 in the masking layer 14 such that grooves 20 are formed in the epitaxial layer 12 down to the substrate 10. The sides of the grooves 20 are straight and perpendicular to the surface of the epitaxial layer 12 due to the etching properties of silicon along the (111) planes.

Figure 3:
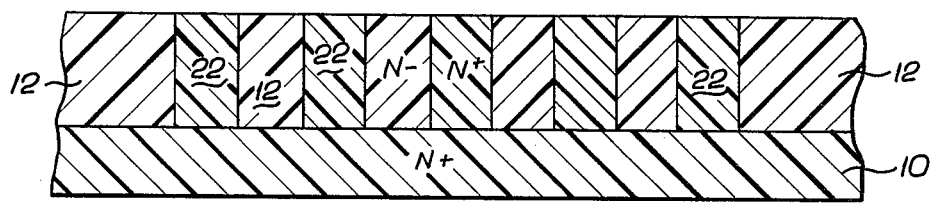
FIG. 3 is a cross-sectional view of a semiconductive device wherein the etched grooves have been back filled with low resistivity epitaxial silicon and the mask has been removed.

As seen in FIG. 3, these grooves 20 are then backfilled with epitaxial silicon of a much lower resistivity than that of the surrounding regions, but also of N type conductivity. The resistivity of this epitaxial silicon is about 1 ohm/cm. This forms a series of discrete N+ pedestals 22 which are in contact with the substrate 10 and extend upwardly therefrom. The structure is such that these lower resistivity pedestals 22 are interdigitated between the surrounding high resistivity regions 12 in the epitaxial layer. The masking layer 14 is then removed using conventional techniques.

Figure 4:
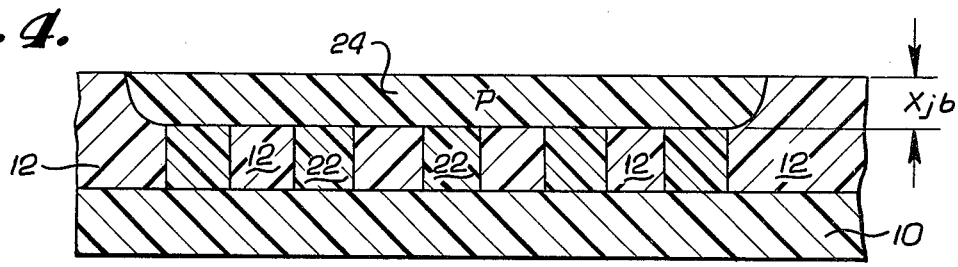
FIG. 4 is a cross-sectional view of a semiconductive device wherein a base region of conductivity type opposite to that of the epitaxial layer and the substrate has been diffused into the epitaxial layer.

The next step, as shown in FIG. 4, is to diffuse P-type dopant into the epitaxial layer 12 containing the pedestals 22 using conventional masking and diffusion techniques. This forms the base 24 of the device. The alignment of the pedestals 22 and the epitaxial layer 12 are such that the sides of the base 24 are within high resistivity regions 12 in the epitaxial layer.

Figure 5:
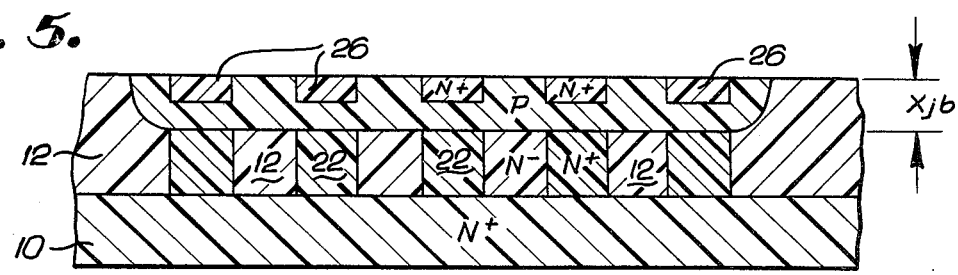
FIG. 5 is a cross-sectional view of a semiconductive device wherein emitter regions of conductivity type opposite to that of the base region have been diffused into the base region at points directly above the lower resistivity epitaxial regions.

Referring next to FIG. 5, N-type dopant is then heavily diffused into areas directly above the pedestals 22 using conventional masking and doping diffusion techniques. These doped areas form the emitters 26 of the transistor device. The basic bipolar transistor structure is thus completed and conventional techniques can be used for the completion of the device. The embodiment illustrated in the figures is a single device wherein the emitters are all interconnected by conventional conductors (not shown).

Of course, it is possible to follow the above procedure while substituting P-type regions for all N-type regions and vice-versa. Also, is it possible to start with a low resistivity epitaxial layer and form appropriate grooves which can then be filled with high resistivity epitaxial silicon. Also , the exact resistivity values given above are not mandatory, but are merely exemplary values.

Several advantages result from the above described method and the structure produced therefrom. The structure described attains the goals of minimizing collector series resistance and base-collector capacitance while maximizing the junction breakdown voltage of the device. The high junction breakdown voltage is attained by virtue of the fact that the sides of the base 24 are surrounded by high resistivity (100 ohms/cm) epitaxial silicon 12. It is at the sides of the base 24 that most junction breakdowns occur. It has been calculated that for an Xjb, which corresponds to the depth of the base 24, of 0.3 to 0.5 microns with the resistivity of the surrounding epitaxial layer 12 being 100 ohms/cm and allowing for junction curvature, the breakdown voltage is approximately 100 volts.

The low collector series resistance is achieved by placing the low resistivity pedestals 22 beneath the emitters 26. Thus the resistance from the emitter 26 directly downward to the pedestal 22 to the collector substrate 10 is minimized since the resistivity of the pedestals 22 is only 1 ohm/cm. A breakdown voltage of 100 volts is very good for a transistor wherein the resistivity between the base and the collector is only 1 ohm/cm. This is especially significant in that this result is obtained without the use of guard rings.

As for the base-collector capacitance, if the entire area beneath the series of emitters 26 were of low resistivity, the capacitance would be high. However, the capacitance of the device with the 100 ohms/cm regions is one-tenth that of the capacitance of a device with only 1 ohm/cm pedestals 22. Thus, the interdigitated structure described results in a significant lowering of the base-collector capacitance.

Using the method described above for forming the pedestals 22, one can precisely control the dimensions of the pedestals 22 as well as the concentration of the dopant in the pedestal 22 since they are formed by the back-filling of the grooves with epitaxial silicon of uniform dopant concentration and thus uniform conductivity. In the prior art neither precision of dimensions nor precision of concentration could be obtained. Using the out-diffusion method of prior art, the pedestals exhibited a substantial dopant concentration gradient with the higher concentration being closer to the collector. This made it difficult to obtain the desired conductivity throughout the height of the pedestal. Using the prior art method, also, the dimensions of the pedestals could not be precisely controlled. The out-diffusion process would result in non-linear edges of the pedestals and thus the exact conductive properties of the pedestals were difficult to control. The present invention overcomes these problems by allowing precise control of the dimensions and the concentration of dopant of the pedestal regions.

While a wide variety of materials, shapes and other configurations can be used in this invention, it should be understood that changes can be made without departing from the spirit or scope of this invention. For example, the method described above is for use with a bipolar power transistor. However, it is just as useful for any device where such a precise, interdigitated structure is desired. The invention, therefore, is not to be limited to the specific embodiments discussed and illustrated herein, but rather only by the scope of the appended claims.

I claim:

1. A method for manufacturing a semiconductor device comprising the steps of:
    forming a plurality of grooves through a high resistivity silicon layer which is disposed on a highly doped silicon substrate of the same type conductivity as said high resistivity silicon layer;
    filling said grooves with low resistivity silicon of the same type conductivity as said substrate such that alternating regions of high and low resistivity extend upward from said substrate;
    diffusing dopant of a type opposite to that of said substrate partially into said high and low resistivity regions to form the base of said semiconductor device;
    diffusing dopant of a type opposite to that of said base into said base at a plurality of discrete locations which are above said low resistivity regions, thus forming a plurality of emitters.

2. The method according to claim 1 wherein the top surface of the high resistivity silicon layer lies in the (110) crystalline plane.

3. The method according to claim 2 wherein the grooves are aligned such that the edges of said grooves are defined by the (111) crystalline planes which lie perpendicular to the (110) surface of the high resistivity silicon layer.

4. The method according to claim 1 wherein the resistivity of said high resistivity silicon layer is approximately 100 ohms/cm.

5. The method according to claim 4 wherein the resistivity of said low resistivity silicon is approximately 1 ohm/cm.

6. The method according to claim 1 wherein said semiconductor device is a bipolar power transistor.

7. The method according to claim 1 wherein the depth of diffusion of said base is approximately 0.3 to 0.5 microns and the total depth of the high and low resistivity layers is approximately 0.6 to 1.5 microns.

8. The method according to claim 1 wherein the base is disposed such that the sides of said base are within high resistivity regions.

9. The method according the claim 1 wherein the substrate, the emitters and the high and low resistivity regions are all of N-type conductivity and the base is of P-type conductivity.

10. The method according to claim 1 wherein the grooves are formed by etching.

11. The method according to claim 1 wherein the layer disposed on said substrate is of low resistivity silicon instead of high resistivity silicon, grooves are formed in said low resistivity layer and high resistivity silicon instead of low resistivity silicon is used to fill in said grooves.

12. The method according to claim 1 wherein said high and low resistivity silicon layers are epitaxial silicon.

13. A method for manufacturing a semiconductor device comprising the steps of:
    forming a plurality of grooves through a silicon layer of one type conductivity and resistivity which is disposed on a highly doped silicon substrate of the same type conductivity as said silicon layer; and
    filling said grooves with silicon of the same type conductivity as said silicon layer but with different resistivity than said silicon layer such that alternating high and low resistivity regions result;
    diffusing dopant of a conductivity type opposite to that of said substrate partially into said high and low resistivity regions to form the base of said semiconductor device;
    diffusing dopant of a type opposite to that of said base into said base at a plurality of discrete locations which are above the regions of lower resistivity, thus forming a plurality of emitters.

* * * * *